(12) United States Patent
Yamawaki (10) Patent No.: US 7,154,323 B2
(45) Date of Patent: Dec. 26, 2006

(54) DELAY CIRCUIT AND CONTROL METHOD OF THE DELAY CIRCUIT

(75) Inventor: Masashi Yamawaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/073,603

(22) Filed: Mar. 8, 2005

(65) Prior Publication Data

US 2005/0168259 A1   Aug. 4, 2005

Related U.S. Application Data

(63) Continuation of application No. PCT/JP03/03640, filed on Mar. 25, 2003.

(51) Int. Cl.
*H03H 11/26* (2006.01)
(52) U.S. Cl. ........................ 327/277; 327/261
(58) Field of Classification Search .............. 327/261, 327/276–278, 284–285
See application file for complete search history.

(56) References Cited

U.S. PATENT DOCUMENTS

| | | | |
|---|---|---|---|
| 5,272,729 A | | 12/1993 | Bechade et al. |
| 6,396,322 B1 | * | 5/2002 | Kim et al. .................. 327/158 |
| 6,483,359 B1 | * | 11/2002 | Lee ............................ 327/158 |
| 6,801,472 B1 | * | 10/2004 | Lee ............................ 365/233 |

FOREIGN PATENT DOCUMENTS

| | | |
|---|---|---|
| JP | 56-047125 A | 4/1981 |
| JP | 5-218820 A | 8/1993 |
| JP | 2002-290217 A | 10/2002 |

\* cited by examiner

*Primary Examiner*—Timothy P. Callahan
*Assistant Examiner*—Cassandra Cox
(74) *Attorney, Agent, or Firm*—Arent Fox PLLC (57) ABSTRACT

A delay circuit is constructed by connecting taps TAP0–n for providing with a unit delay time ($\tau$) in series on multiple stages. Each tap has the same configuration and an objective signal is inputted to a signal input terminal IN1. The output terminal of a preceding stage tap is connected to a between-stages connecting terminal IN2. An output terminal O is connected to the between-stages connecting terminal of a next stage tap. The signal input terminal and the between-stages connecting terminal are connected to one input terminal of NAND gates 1, 2 and a tap selection signal is inputted to the other input terminal. The output terminal is connected to a NAND gate 3. One of the NAND gates 1, 2 functions as a logical inversion gate corresponding to a tap selection signal so as to enable propagation of the signal. At this time, in the other NAND gate, the output signal is fixed to high level and the NAND gate 3 also functions as a logical inversion gate. The objective signal is propagated by the NAND gates 1, 3 and the preceding stage signal is propagated by the NAND gates 2, 3. By constructing the NAND gates 1, 2 with the same structure, the unit delay time ($\tau$) can be matched accurately.

10 Claims, 8 Drawing Sheets

| UPPER DECODE SIGNAL DU[x] | POSITION OF NAND GATE GROUP TO BE SELECTED | | | | | | | |
|---|---|---|---|---|---|---|---|---|
| 0  | 0000 | 0000 | 0000 | 0000 | 0000 | 0000 | 0000 | 0011 |
| 1  | 0000 | 0000 | 0000 | 0000 | 0000 | 0000 | 0000 | 0110 |
| 2  | 0000 | 0000 | 0000 | 0000 | 0000 | 0000 | 0000 | 1100 |
| 3  | 0000 | 0000 | 0000 | 0000 | 0000 | 0000 | 0001 | 1000 |
| 4  | 0000 | 0000 | 0000 | 0000 | 0000 | 0000 | 0011 | 0000 |
| 5  | 0000 | 0000 | 0000 | 0000 | 0000 | 0000 | 0110 | 0000 |
| 6  | 0000 | 0000 | 0000 | 0000 | 0000 | 0000 | 1100 | 0000 |
| ⋮  |      |      |      |      | ⋮    |      |      |      |
| 27 | 0001 | 1000 | 0000 | 0000 | 0000 | 0000 | 0000 | 0000 |
| 28 | 0011 | 0000 | 0000 | 0000 | 0000 | 0000 | 0000 | 0000 |
| 29 | 0110 | 0000 | 0000 | 0000 | 0000 | 0000 | 0000 | 0000 |
| 30 | 1100 | 0000 | 0000 | 0000 | 0000 | 0000 | 0000 | 0000 |
| 31 | 1000 | 0000 | 0000 | 0000 | 0000 | 0000 | 0000 | 0000 |

| TAP SELECTION SIGNAL S[x] | POSITION OF SELECTED TAP | | | | | |
|---|---|---|---|---|---|---|
| 0 | 0000 | 0000 | ⋯ | 0000 | 0000 | 0001 | 0001 |
| 1 | 0000 | 0000 | ⋯ | 0000 | 0000 | 0010 | 0010 |
| 2 | 0000 | 0000 | ⋯ | 0000 | 0000 | 0100 | 0100 |
| 3 | 0000 | 0000 | ⋯ | 0000 | 0000 | 1000 | 1000 |
| 4 | 0000 | 0000 | ⋯ | 0000 | 0001 | 0001 | 0000 |
| 5 | 0000 | 0000 | ⋯ | 0000 | 0010 | 0010 | 0000 |
| 6 | 0000 | 0000 | ⋯ | 0000 | 0100 | 0100 | 0000 |
| ⋮ | | | ⋮ | | | |
| n−4 | 1000 | 1000 | ⋯ | 0000 | 0000 | 0000 | 0000 |
| n−3 | 1001 | 0000 | ⋯ | 0000 | 0000 | 0000 | 0000 |
| n−2 | 1010 | 0000 | ⋯ | 0000 | 0000 | 0000 | 0000 |
| n− | 1100 | 0000 | ⋯ | 0000 | 0000 | 0000 | 0000 |
| n | 1000 | 0000 | ⋯ | 0000 | 0000 | 0000 | 0000 |

DELAY CIRCUIT AND CONTROL METHOD OF THE DELAY CIRCUIT

CROSS-REFERENCE TO RELATED APPLICATIONS

This application is a continuation application based upon and claims the benefit of the prior PCT International Patent Application No. PCT/JP2003/003640 filed on Mar. 25, 2003, the entire contents of which are incorporated herein by reference.

FIELD OF THE INVENTION

The present invention relates to a delay circuit capable of adjusting the delay time of signal propagation accurately and a control method of the delay circuit.

DESCRIPTION OF RELATED ART

In recent years, the multi-function of electronic devices has progressed and a delay circuit capable of high precision delay control has been demanded for the necessity of accurately generating signals necessary for data access in, for example, an optical disk recording unit. Accompanied by the multi-function of the devices, the operating speed of semiconductor integrated circuit device has progressed to higher level. Due to the increased speed in the CPU, system LSI and the like, the operating allowance of transition timing between signals in an internal critical path has been strict and adjusting accuracy of delay time in the delay circuit for timing adjustment has been becoming stricter and stricter.

Figure 8:
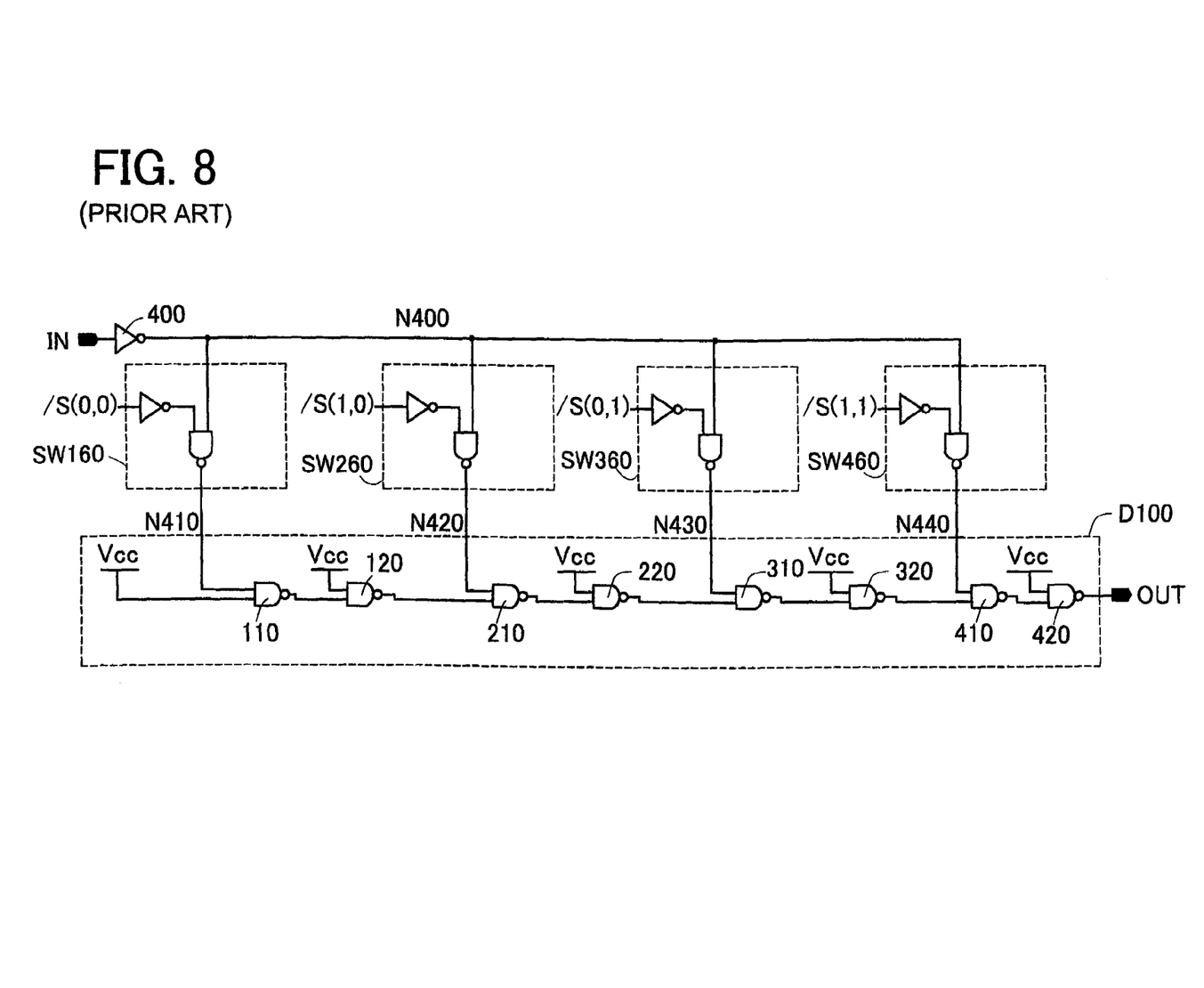
FIG. 8 is a circuit diagram showing a delay circuit of conventional technology.

As shown in FIG. 8, in the delay circuit disclosed in the Japanese unexamined patent publication No. 2002-290217, any one of control signals /S (0,0) to /S (1, 1) is activated at a low level and any one of selection switch portions SW160 to SW460 is selected. An input signal IN is propagated to terminals N410–N440 through the selection switch portions SW160 to SW460 from a terminal N400 via an inverter gate 400.

The terminals N410–N440 are connected to one input terminal of NAND gates 110–410 of a delay portion D100. The output terminal of each of the NAND gates 110–410 is connected to one input terminal of each of NAND gates 120–420 the other input terminal of which is connected to a power supply voltage Vcc. Then, the output terminals of the NAND gates 120–320 are connected to the other input terminals of NAND gates 210–410 on a next stage and the output terminal of the NAND gate 420 is connected to an output terminal OUT. The other input terminal of the NAND gate 110 is connected to a power supply voltage Vcc.

In the delay portion D100, the NAND gates 110, 120–410 and 420 of two-stage structure constitute a predetermined delay unit. That is, the NAND gates 110, 120 of the first stage unit function as a logical inversion gate of two-stage structure because the input terminals of both are connected to the power supply voltage Vcc. As for the NAND gates 210, 220–410, 420 of a subsequent stage unit, the power supply voltage Vcc is connected to the input terminals of the NAND gates 220–420. If the control signals /S(0,0)–/S(1,1) turn to high level so that they are inactivated, the terminals N420–N440 also turn to high level and if any one of the control signals /S(0,0)–/S(1,1) turns to low level so that it is activated, an input signal from a preceding stage unit turns to high level, so that it functions as the logical inversion gate of two-stage structure.

After the input signal IN is propagated to any one of the terminals N410–N440, it is outputted from the output terminal OUT through a predetermined delay unit of the quantity of units corresponding to the terminals N410–N440. An output signal supplied with delay signals corresponding to the quantity of units of the predetermined delay units through which the signal propagates is outputted.

SUMMARY OF THE INVENTION

However, in the delay circuit of the conventional art, the output terminal of the predetermined delay unit is inputted to the NAND gates 210–410 of next stage unit and signals from the selection switch portions SW260–SW460 are inputted to the NAND gates 210–410. Thus, there is such a problem that an output signal of a preceding stage and the input signal IN collide with each other in the NAND gates 210–410 of each stage. That is, if the control signal is at high level indicating the inactive state in its steady state, the signal level from the selection switch portions SW260–SW460 is maintained at high level. The signal level of an output terminal from a non-selective predetermined delay unit is maintained at high level. If any one of the signals is of high level, the NAND gates 210–410 function as a logical inversion element. Consider a case where the control signal which should maintain its inactive state is changed from this state to low level temporarily due to a hazard when the signal is switched over. Because if the high level signal from the preceding stage is maintained, the NAND gates 210–410 act as a logical inversion element, there is such a fear that the input signal IN may be propagated through a predetermined delay unit corresponding to erroneous activation. That is, if the control signal which should maintain high level non-activation state turns to low level temporarily, the selection switch portions SW260–SW460 are selected so that an unexpected delay path from the input signal IN is formed. This is problematic because an erroneous delay signal is propagated to the output terminal OUT depending on the period of the erroneous activation.

Particularly, if the predetermined delay unit is constructed of multiple stages and the activation circuit of the control signal becomes complicated, the possibility that a plurality of control signals maybe activated temporarily when the signal is switched over increases. Each time when the control signal is switched over, an unexpected signal can be outputted from the output terminal OUT, which is a problem to be solved.

Further, in the delay circuit of the conventional technology, when the control signal is changed over in the direction of increasing the amount of delay, the high level output signal of a predetermined delay unit, which is located between predetermined delay units selected before and after the switching and maintained in the non-selective state, can be propagated to the output terminal OUT, which is another problem to be solved. For example, if the input signal IN changes to high level after the control signal is switched over, a high level signal can be outputted prior to a delay signal corresponding to a proper transition signal so that a signal having an erroneous delay time can be outputted.

In the delay circuit of the conventional technology, because the input signal IN is inputted to the respective selection switch portions SW160–SW460 through an inverter gate 400, wiring from the inverter gate 400 to the respective selection switch portions SW160–SW460 is difficult to place equally. Particularly, in case where the predetermined delay unit is constructed in multiple stages, it is more difficult to equalize every wiring path from an inverter gate 400. It can be considered that load components such as parasitic resistance and parasitic capacitance differ depending on each wiring path due to differences in the length of path between wirings and surrounding environment, so that the delay time of signal propagation comes to differ. There is such a fear that the delay control to the input signal IN cannot be controlled precisely, which is a problem to be solved.

The present invention has been achieved to solve any one of the above-described problems of the conventional technology and an object of the present invention is to provide a delay circuit capable of controlling a delay time which should be added to the input signal accurately and switching over the delay time stably and a control method of the delay circuit.

In the delay circuit of the present invention achieved to attain the above-described object comprises unit delay units, each of which includes a first logical portion for propagating a signal inputted to a first input terminal and outputting a propagation signal corresponding to a unit selection signal indicating selective status, a second logical portion for propagating a signal inputted to a second input terminal and outputting a propagation signal corresponding to a unit selection signal indicating non-selective status, having the same propagation delay time as the first logical portion, and a third logical portion for propagating the propagation signal outputted from the first logical portion and the propagation signal outputted from the second logical portion and outputting a signal to an output terminal, the objective signal being inputted to the first input terminal and the output terminal of the unit delay unit of a preceding stage being connected to the second input terminal. Here, the first logical portion and the second logical portion have each similar propagation delay time.

An objective signal is inputted to a first input terminal of each unit delay unit and the objective signal is propagated through a first logical portion in a single unit delay unit selected corresponding to a unit selection signal. Further, the output terminal of a unit delay unit of a preceding stage is connected to a second input terminal and in the unit delay unit turned to non-selective status corresponding to a unit selection signal, a propagation signal from the preceding stage is inputted and propagated through a second logical portion.

As a result, an objective signal inputted from a first input terminal in a unit delay unit selected by a unit selection signal is provided with a unit delay time by the first and third logical portions and outputted from an output terminal. The outputted signal is inputted from the second input terminal in the unit delay unit of subsequent stages after a next stage and provided with a unit delay time by the second and third logical portions and propagated successively. Consequently, the objective signal is provided with a predetermined delay time. An unnecessary signal inputted through the second input terminal from a unit delay unit existing at a preceding stage of the unit delay unit in which the object signal is propagated is blocked from the propagation by the second logical portion. Even if the unit selection signal which should maintain its non-selective status is switched over turns to selective status temporarily due to hazard when the signal and an objective signal is propagated from a unit delay unit at an erroneous position, the propagation of the signal can be blocked at a second input terminal of the unit delay unit located at its proper selection position. Consequently, it is possible to prevent an erroneous delay signal accompanied by erroneous activation when a signal is switched from being outputted.

The control method of delay circuit of the present invention accomplished to meet the above-described object, for a delay circuit for inputting an objective signal from any unit delay unit selected from the plurality of unit delay units connected in series so as to provide with a predetermined delay time, comprises establishing a signal path for propagating the objective signal inputted in the unit delay unit selected, blocking a signal path from the unit delay unit of proceeding stage in the unit delay unit selected, blocking a signal path for propagating the objective signal inputted in the unit delay unit not selected, and establishing a signal path from the unit delay unit of a preceding stage in the unit delay unit not selected.

A single unit delay unit is selected and a signal path from a preceding stage is blocked to propagate an objective signal. The propagation of the objective signal to a non-selected unit delay unit is blocked and a signal from a signal path from the unit delay unit of the preceding stage is propagated.

Consequently, the objective signal inputted to the unit delay unit selected by the unit selection signal is provided with a unit delay time and propagated to a next stage. In the unit delay unit of subsequent stages, a signal from the preceding stage is inputted and provided with a unit delay time and then propagated successively. An objective signal is provided with a predetermined delay time and outputted. On the other hand, any unnecessary signal inputted from a unit delay unit located at a preceding stage of the unit delay unit in which the objective signal is inputted is blocked from being propagated. If the unit delay unit which should maintain its non-selective status is turned to selective status temporarily due to hazard at the time of signal switch-over and an objective signal is propagated mistakenly, the propagation of the signal can be blocked by the unit delay unit located at its proper selection position. Consequently, any erroneous delay signal accompanied by erroneous activation at the time of signal switch-over can be blocked from being outputted.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

As evident from the above description, the present invention provides a delay circuit capable of controlling the predetermined delay time to be applied to an input signal accurately and obtaining an output signal stably when the predetermined delay time is switched over, and a control method of the delay circuit.

DETAILED DESCRIPTION OF THE PREFERRED EMBODIMENTS

Hereinafter, the specific embodiment of the delay circuit and control method of the delay circuit of the present invention will be described in detail with reference to FIGS. 1–7.

Figure 1:
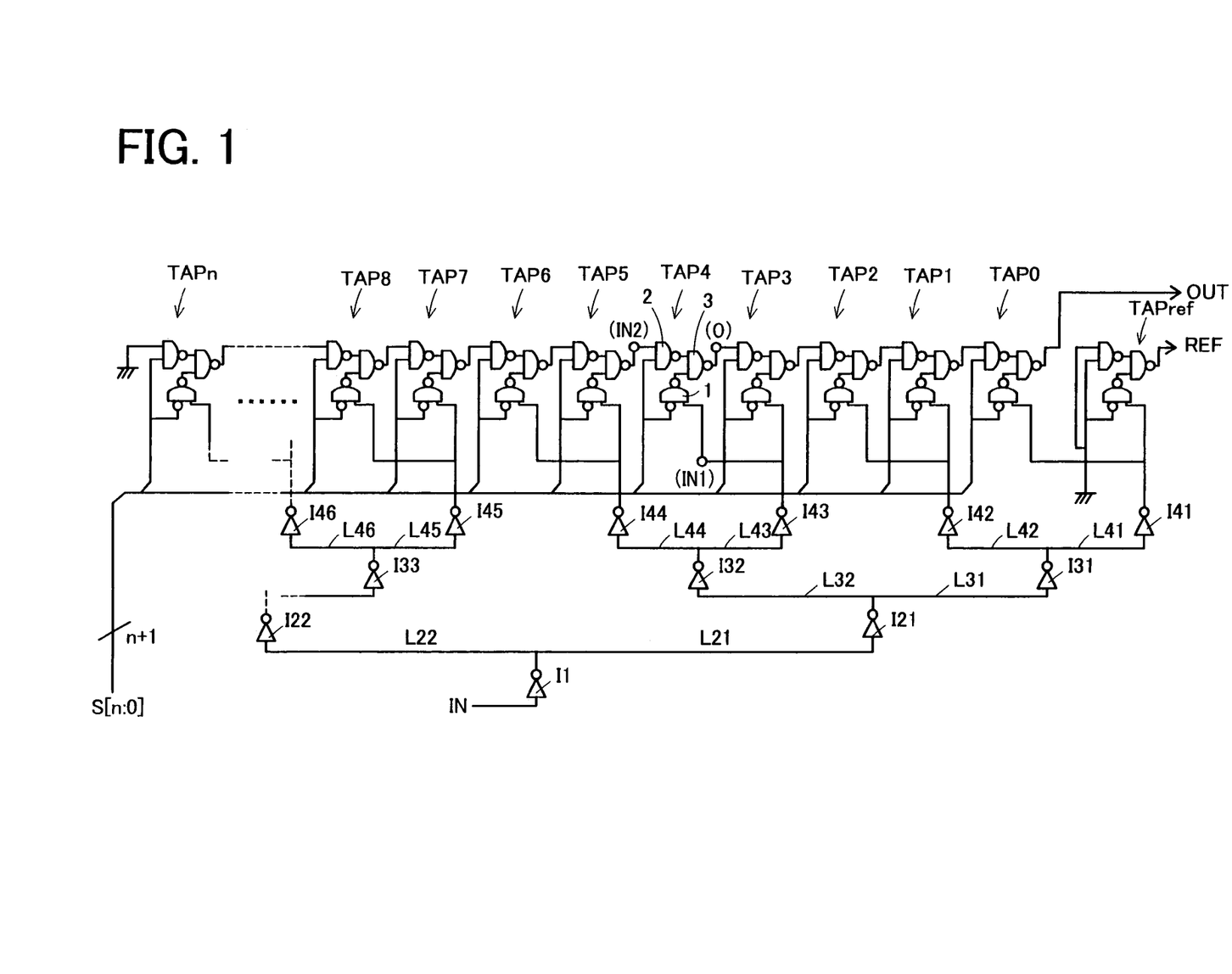
FIG. 1 is a circuit diagram showing a delay circuit of the embodiment of the present invention.

FIG. 1 shows a delay circuit of the embodiment of the present invention. In the delay circuit of the embodiment, unit delay units for applying unit delay time ($\tau$) (hereinafter referred to as tap) TAP0–TAPn are connected in series to form multiple stages.

All the respective taps TAP0–TAPn have the same configuration. The internal structure of the tap will be described with reference to FIG. 1 by taking a tap TAP4 as an example. An objective signal for applying a predetermined delay is inputted to a signal input terminal IN1, which is an example of the first input terminal. The output terminal of a preceding stage TAP 5 is connected to a between-stages connecting terminal IN2, which is an example of the second input terminal. An output terminal O of the tap TAP 4 is connected to the between-stages connecting terminal of a next stage tap TAP 3.

A signal input terminal IN1 is connected to one input terminal of an NAND gate 1, which is an example of a first logical portion and the between-stages connecting terminal IN2 is connected to one input terminal of a NAND gate 2 which is an example of the second logical portion. The output terminals of the NAND gate 1, 2 are connected to the input terminal of a NAND gate 3, which is an example of the third logical portion. A tap selection signals S[n:0], which is an example of a unit selection signal for selecting a tap individually or a unit addition selection signal, is inputted to the other input terminals of the NAND gates 1, 2. A tap selection signal S[4] is inputted to a tap TAP4.

Here, the NAND gates 1, 2 are enabled to propagate signals from the signal input terminal IN1 and the between-stages connecting terminal IN2 at high level and low level of the tap selection signal S[4]. That is, the NAND gate 1 functions as a logical inversion gate to the tap selection signal S[4] of low level and an objective signal to be inputted to the signal input terminal IN1 is logically inverted and outputted. More specifically, a logical inversion gate for logically inverting the tap selection signal S[4] such as an inverter gate or the like is provided so as to input to the other input terminal of the NAND gate 1 as a high level signal. Consequently, the NAND gate exerts the logical inversion function by inputting a high level signal. Likewise, the NAND gate 2 functions as logical inversion gate to the high level tap selection signal S[4] and the output signal of the preceding stage tap TAP5, which is inputted to the between-stages connecting terminal IN2, is logically inverted and outputted.

If the logical level of the tap selection signal S[4] is inverted from the above-mentioned logical level, the output terminals of the NAND gates 1, 2 are fixed to high level. That is, if the high level tap selection signal S[4] is inputted to the NAND gate 1, it is inverted and low level is inputted to the input terminal. The low level tap selection signal S[4] is also inputted to the input terminal of the NAND gate 2. Consequently, the output signal of the NAND gate is fixed to high level by the low level signal input.

In the NAND gates 1, 2, a signal is propagated to any one of the output terminals by the tap selection signal S[4] so that the other output signal of the NAND gate is fixed to high level. Therefore, the NAND gate 3 to which the output terminals of the NAND gates 1, 2 are connected, functions as a logical inversion gate regardless of the logical level of the tap selection signal S[4]. That is, a signal path is established to the low level tap selection signal S[4] by the NAND gates 1, 3, an objective signal to be inputted to the signal input terminal IN1 is logically inverted twice and signals of the same phase are outputted from the output terminal 0. A sum of propagation delay times of signals in the NAND gates 1, 3 is provided as unit delay time ($\tau$). Likewise, a signal path is established to the high level tap selection signal S[4] by the NAND gates 2, 3, a signal inputted to the between-stages connecting terminal IN2 is logically inverted twice and signals of the same phase are outputted from the output terminal O. A sum of the propagation delay times of signals in the NAND gates 2, 3 is provided as unit delay time ($\tau$). If the NAND gates 1, 2 are constructed in the same structure, because the NAND gate 3 is common in the signal path of both, the unit delay time ($\tau$) to be provided by each signal path can be matched accurately.

As for the tap selection signals S[n:0], any selection signal turns to low level so that any tap of taps TAP0–TAPn is selected and then, an objective signal is inputted from the signal input terminal. Other tap selection signals maintain high levels and for taps in which these selection signals are to be inputted, signals from the between-stages connecting terminals can be inputted. Therefore, if a case where a tap TAP4 is selected by the tap selection signal S[4] is exemplified, an objective signal to be inputted from the signal input terminal IN1 propagates to the output terminal O and after that, propagates to subsequent taps TAP3–0 on stages following the next one through the between-stages connecting terminal successively and is outputted from the output terminal of the tap TAP0 as the output signal OUT.

That signal is propagated through the tap TAP4 and the subsequent taps TAP3–0 and consequently, the unit delay time ($\tau$) of these taps TAP4–0 are added to obtain the output signal OUT having the predetermined delay time (5 $\tau$).

On the other hand, as for the preceding stage taps TAP5–n connected from the between-stages connecting terminal IN2 of the tap TAP4 to the preceding stage, a signal path is established through the between-stages connecting terminal. Because a ground potential is connected to the between-stages connecting terminal of the most preceding stage tap TAPn, which is an initial stage of this signal path, each output terminal of the preceding stage taps TAP5–n is fixed to low level. Although low level is applied to the between-stages connecting terminal IN2 of the selected tap TAP4, because the output signal of the NAND gate 2 is fixed to high level by the tap selection signal S[4] of low level, the signal path from the preceding stage taps TAP5–n is intercepted by the between-stages connecting terminal IN2.

The input signal IN to be provided with a predetermined delay time by the delay circuit needs to be supplied to each signal input terminal of all taps TAP0–n as the objective signal. If the delay circuit is constituted of multiple taps TAP0–n, the adjustment range of a predetermined delay time to the input signal IN is expanded or the adjustment step can be set finely. However, in this case, it is necessary to construct the load component in a supply path of the input signal IN to each tap equally and make signal propagation delay on the supply path substantially equal. The embodiment of FIG. 1 indicates a wiring structure for making the load component on the supply path substantially equal.

The supply circuit of the input signal IN has a so-called tree structure for supplying a signal to the signal input terminal of each tap from the input signal IN successively through inverter gates I1, I21–I22, I31–I33, . . . I41–I46, . . . disposed on multiple stages. Wiring between stages for connecting the inverter gate of each stage is placed in an equal length. That is, wiring L21 and wiring L22 for connecting between an inverter gate I1 and inverter gates I21, I22, wiring L31 and wiring L32 for connecting between an inverter gate I21 and inverter gates I31, I32, wiring L41, L42, wiring L43, L44, wiring L45, L46, for connecting between inverter gates I31/I32/I33 and inverter gates I41, I42/I43, I44/I45, I46 are placed in an equal length each. When the wiring is placed in an equal length here, needless to say, the wiring width needs to be constructed equally. Further, it is preferable to construct of the same wiring material and secure the same surrounding environment. To secure the equal surrounding environment, it is preferable to keep the positional relation including a distance between other wirings and devices disposed in the surrounding and an intersection thereof, and a bias condition applied to these wirings and devices substantially equally. Consequently, the delay time of signal propagation in wiring originating from wiring resistance or parasitic load can be made substantially equal.

The inverter gate constituting each stage is preferred to have the same structure for each stage. The reason is that the inverter gate of the same structure can secure a substantially equal propagation delay time to propagation of signal.

Although the tree structure of four stages is exemplified in FIG. 1 for convenience of explanation, needless to say, the quantity of stages is increased or decreased depending on the number of taps in the delay circuit. Further although a case where the signal wiring is branched to two lines between stages is exemplified, the same structure can be attained even if it is branched to three or more. Further, although a case where the stages of the inverter gates are constructed with four stage, namely, even stages and a signal having the same phase as the input signal IN is supplied to the tap, is exemplified, needless to say, the number of the inverter gates is permitted to be odd depending on the circuit structure of the taps or logical inversion or the like is applied to the output signal OUT. This structure can be constructed of a buffer circuit in which input and output signals are of the same phase instead of the inverter gate.

According to the embodiment of FIG. 1, a tap TAPref is disposed independently. An objective signal is inputted to the signal input terminal from the inverter gate I41. The between-stages connecting terminal is connected to a ground potential. Further, the ground potential is connected instead of the tap selection signals [n:0]. This is equivalent to a case where the tap selection signal is fixed to low level and fixed to a setting in which the objective signal is propagated. The objection signal is inputted with substantially the same delay time as input to other taps TAP0–n from the input signal IN through the tree structure. The inputted objective signal is provided with unit delay time ($\tau$) and outputted as a reference output signal REF. Consequently, the reference output signal REF having minimum delay time can be always obtained, which is very convenient.

Figure 2:
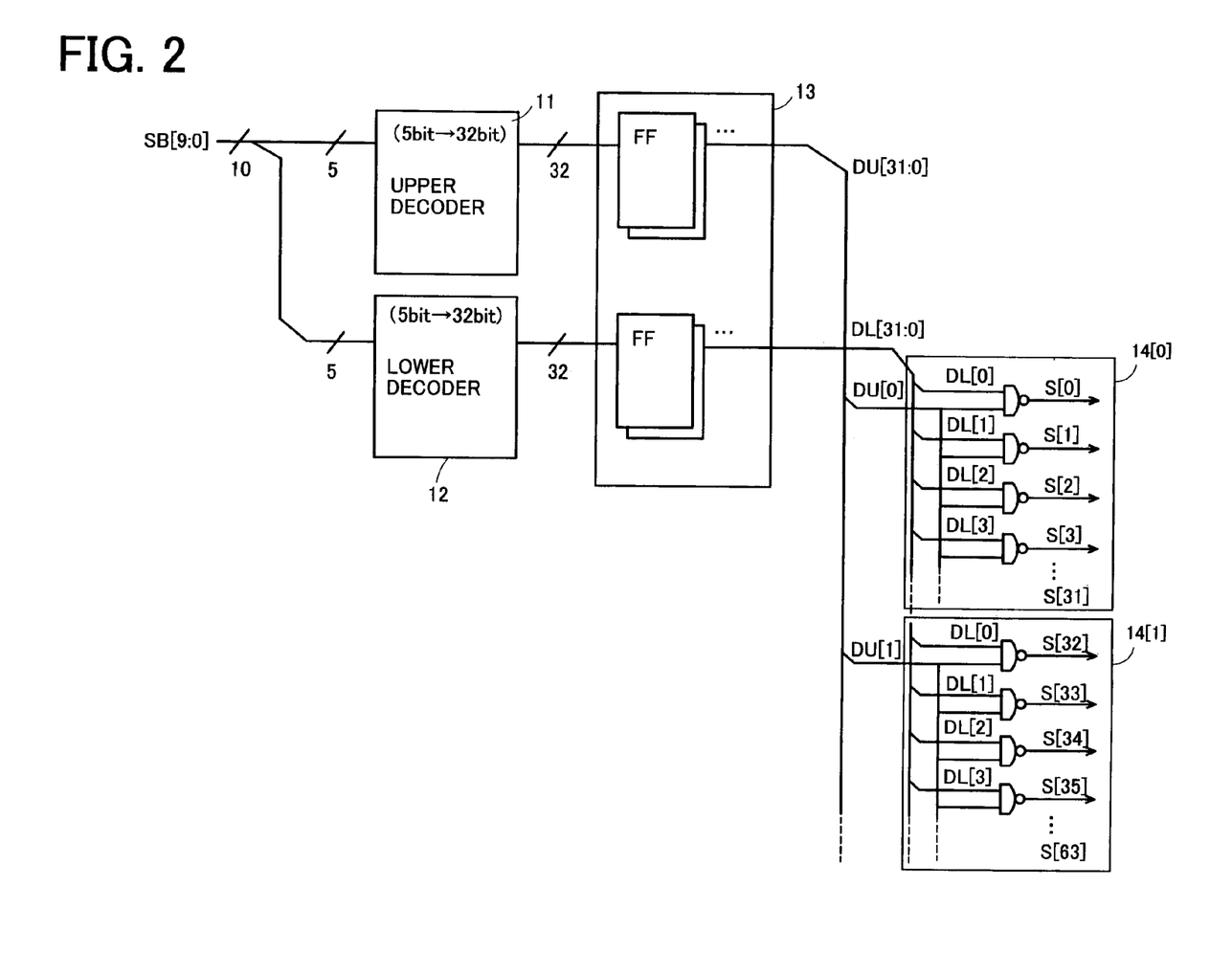
FIG. 2 is a circuit diagram showing a tap selection circuit of the embodiment.

The embodiment of FIG. 2 shows a tap selection circuit for generating the tap selection signals S[n:0]. As for the tap selection signals S[n:0], any one of the selection signals is selected so as to select any one of the taps TAP0–n. The tap selection signals S[n:0] is obtained by decoding binary sequence for identifying a tap.

Although the switch-over of a selected tap is carried out by changing over the tap selection signal, a difference in time is generated at a tap selection signal switch-over timing originating from decoding or the like at the time of the switch-over thereby producing a fear that hazard may occur in not yet selected tap selection signal. To prevent erroneous selection of the tap due to such a fluctuation of the tap selection signal, it is effective to synchronize respective decode bit signals decoded with flip-flop or the like, fetch in and supply as a tap selection signal.

However, as the quantity of stages of the taps TAP0–n in the delay circuit increases, a number of the flip-flops are needed, unpreferably so that the scale of the tap selection circuit increases.

Thus, in the tap selection circuit shown in FIG. 2 in which the quantity of the taps is 1024 ($=2^{10}$) stages (n=1023) as an embodiment, the circuit size is compressed. The binary series SB[9:0] for identifying the taps TAP0–n (n=1023) are divided to upper 5 bits and lower 5 bits and each of them is decoded with a upper decoder 11 and a lower decoder 12. Upper and lower decode bit strings of 32 bits each, decoded by the upper and lower decoders 11, 12 are fetched into a flip-flop group 13, which is an example of a synchronism obtaining portion. The fetch-in is executed with a synchronous signal such as clock signal (not shown) to every flip-flop at the same time. The upper and lower decode bit strings fetched into the flip-flop group 13 are outputted to a NAND gate groups 14 [31:0], which is an example of logical operation portion as synchronized upper decode signals DU [31:0] and lower decode signals DL [31:0].

The NAND gate groups 14 [31:0] are provided for each of the upper decode signals DU [31:0]. In the NAND gate groups 14 [31:0], lower decode signals DL [31:0] are subjected to logical product operation for each of the upper decode signals DU [0]–DU [31] and tap selection signals S[n:0] (n=1023) are outputted. That is, in the NAND gate group 14[0], the upper decode signal DU[0] is inputted to each NAND gate in pair with each of the lower decode signals DL[31:0] and the tap selection signal S[0]–S[31] are outputted. In the NAND gate group 14[1], the upper decode signal DU[1] is inputted to each NAND gate in pair with each of the lower decode signals DL[31:0] and the tap selection signal S[32]–S[63] are outputted. In the same way, the upper decode signal DU[2]–DU[31] are inputted to each NAND gate in pair with each of the lower decode signals DL[31:0] and the tap selection signal S[64]–S[n] (n=1023) are outputted.

Any 1 bit of the upper decode signals DU[31:0] and any 1 bit of the lower decode signals DL[31:0] are selected so that high level is selected. Therefore, a low level tap selection signal is outputted from any one NAND gate in the NAND gate groups 14[31:0].

Consequently, the quantity of disposed flip-flops can be reduced largely from 1023 pairs to 64 pairs and the size of the tap selection circuit can be reduced largely. Because the upper and lower decode signals DU[31:0], DL[31:0] are synchronized and outputted, no hazard is generated when the tap selection signal is switched over. Further, because the tap selection signals S[n:0] can be generated from the upper and lower decode signals DU[31;0], DL[31:0] through a NAND gate of a single stage, a difference in time at the time of switch-over of the tap selection signal is no problem.

Next, a case of selecting two taps TAP0–n (n=1023) at the same time will be described with reference to FIGS. 3–6. This is the case where the unit selection signal and the unit addition selection signal are selected at the same time.

Figure 3:
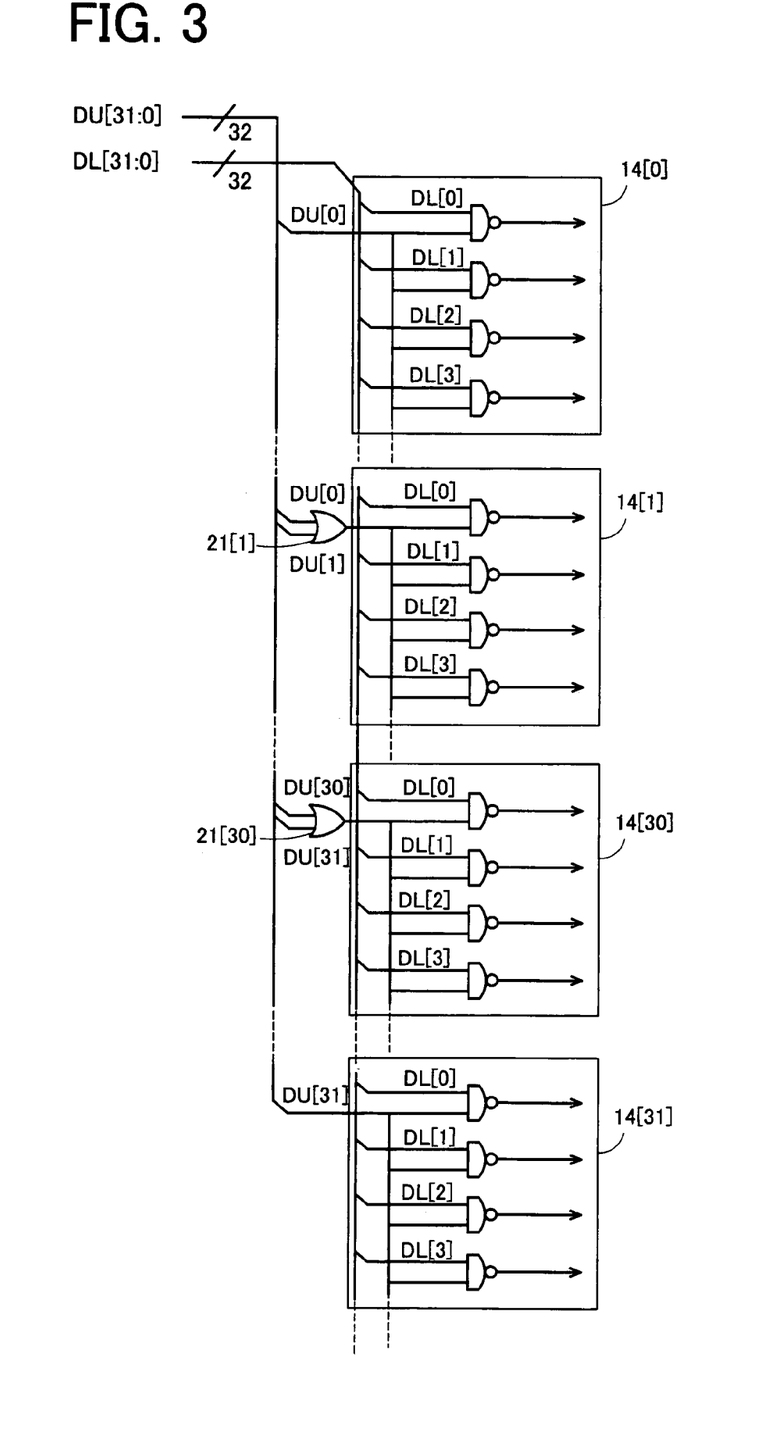
FIG. 3 is a circuit diagram showing a first circuit example for selecting a plurality of taps at the same time in FIG. 2.
Figure 4:
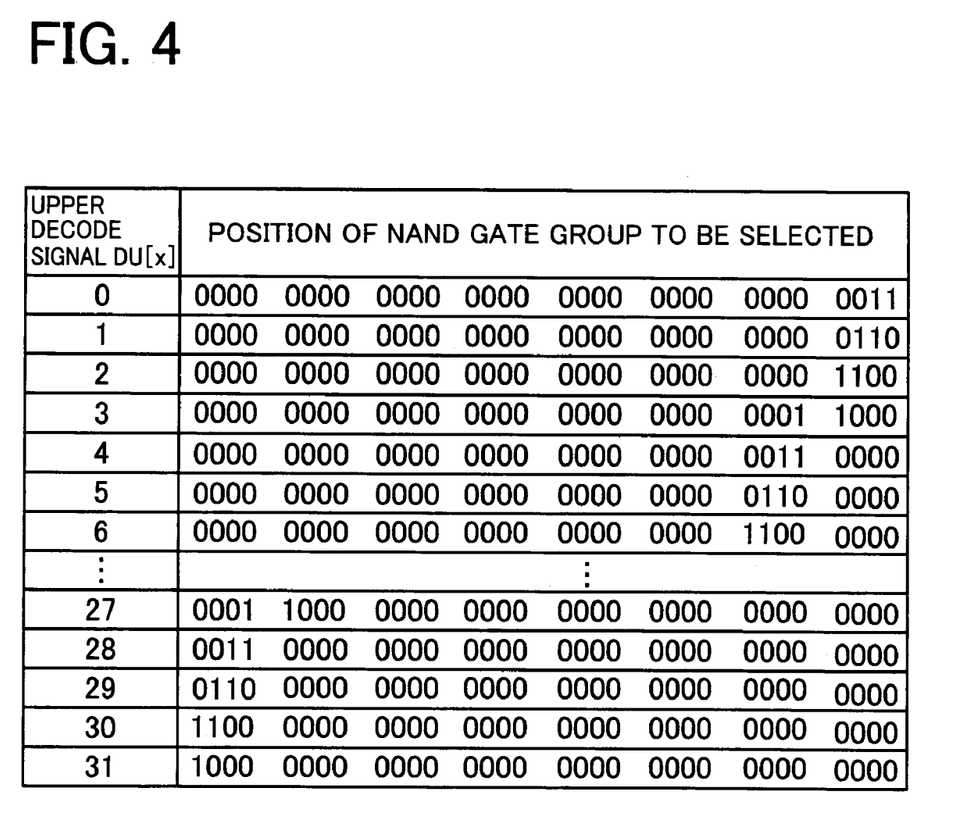
FIG. 4 is a correspondence table in case where they are selected at the same time according to the first circuit example of FIG. 3.

FIGS. 3, 4 show the structure for logical sum operation to the upper decode signal in the tap selection circuit of FIG. 2. FIG. 3 shows provision of a logical sum gates 21 [30:1] between the upper decode signals DU[31:0] and the NAND gate group 14 in addition to the NAND gate groups 14[0], 14[31] on the lowest level and the highest level. That is, while in the lowest level NAND gate group 14[0] and in the highest level NAND gate group 14[31], the upper decode signal DU[0] and the upper decode signal DU[31] are inputted to each NAND gate, in the NAND gate groups 14[30:1] at an intermediate position, an output signal is inputted from a logical sum gates 21[30:1] to each NAND gate.

Adjacent two bits in the upper decode signals DU [31:0] are inputted to the logical sum gates 21[30:1] successively. The upper decode signals DU[0] and DU[1], DU[1] and DU[2], ... DU[30] and DU[31] are inputted from the logical sum gate 21[1] corresponding to the lower NAND gate group 14 [1] successively. Consequently, the adjacent NAND gate groups 14[30:1] are selected by the same upper decode signal. Because the lower decode signals DL[31:0] are inputted to each NAND gate groups 14[30:1] commonly, a tap selection signal located at a position far by 32 bits which is the bit number of the lower decode signals DL[31:0] as a predetermined distance is selected at the same time. However, a case where a proper selection position is selected from the highest level NAND gate group 14[31] is excluded. The reason is that no tap to be selected exists on a further higher level. FIG. 4 shows a correspondence between the upper decode signals DU[31:0] described above and the NAND gate groups 14 [31:0] to be selected.

In the meantime, a case where the binary SB[9:0] are divided equally to the upper bit string and the lower bit string each having 5 bits in the tap selection circuit of FIG. 2 is shown here. By adjusting the bit number contained in the upper bit string, a predetermined distance between two taps selected at the same time can be adjusted. If the bit number of the upper bit string is large, the predetermined distance is decreased and if the bit number of the upper bit string is small, the predetermined distance is increased.

Figure 5:
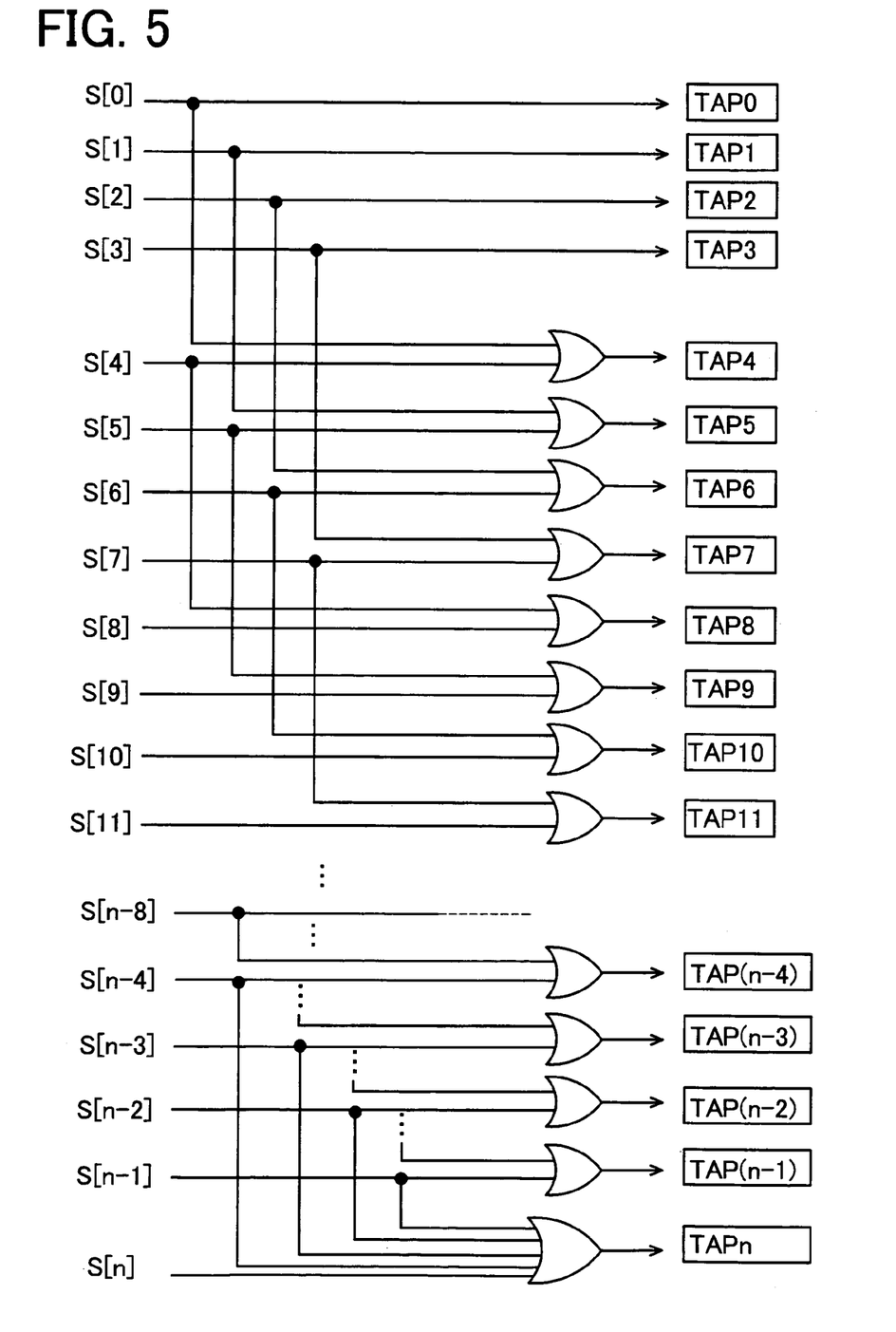
FIG. 5 is a correspondence table in case where a plurality of taps are selected at the same time according to the second circuit example of FIG. 2.
Figure 6:
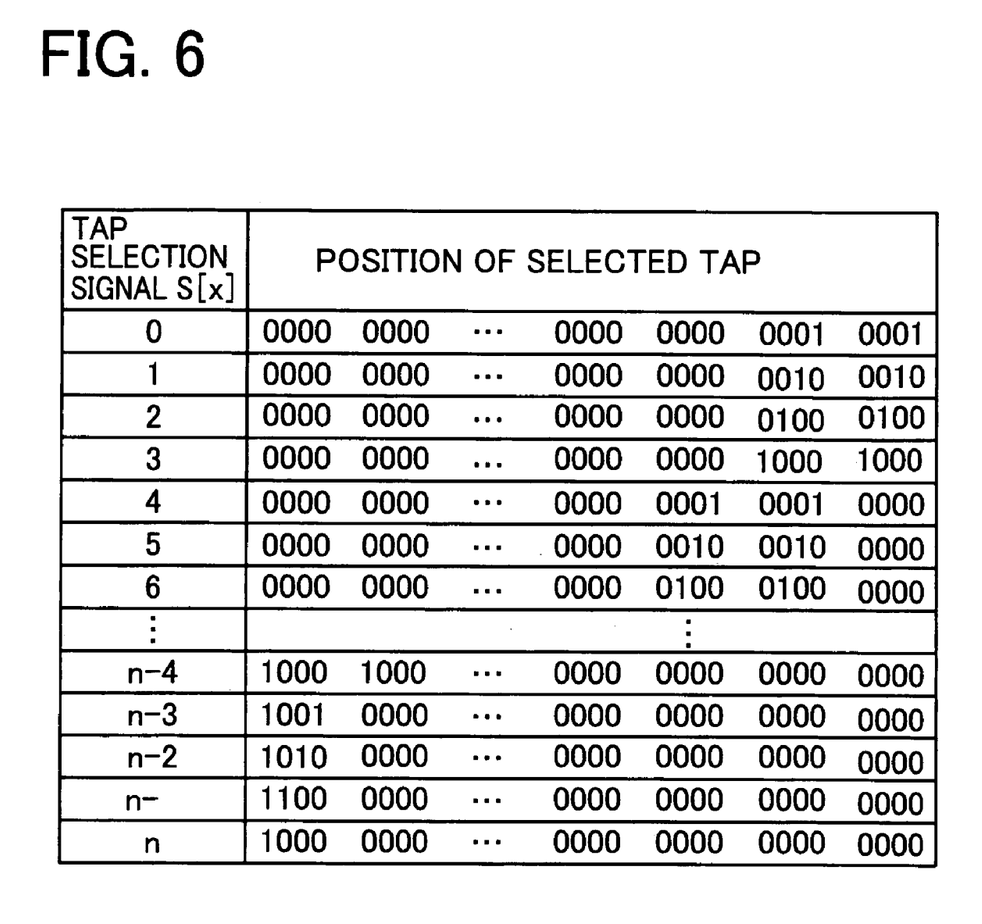
FIG. 6 is a correspondence table in case where they are selected at the same time according to the second circuit example of FIG. 5.

FIGS. 5, 6 show the structure for logical sum operation to the tap selection signals S[n:0] in the tap selection circuit of FIG. 2. The predetermined distance is 4 bits and this indicates a case where in addition to the tap which should be selected properly, a tap located ahead by 4 bits are selected at the same time. The tap selection signals S [n–4:0] are inputted to the logical sum gate together with tap selection signals S[n:4] located ahead by 4 bits and taps TAP[n:4] are selected in addition to the taps TAP [n–4:0] which should be selected properly. The tap selection signals S[n-1:n–3] are inputted to the logical sum gate together with the highest level tap selection signal S[n] and the tap TAP[n] is selected in addition to the taps TAP[n–1:n–3] which should be selected properly. FIG. 6 shows a correspondence between the tap selection signals S[n:0] described above and the position of the selected taps TAP[n:0]. By adjusting a combination of the tap selection signals to be inputted to the logical sum gate, the predetermined distance between taps which should be selected at the same time can be adjusted.

Figure 7:
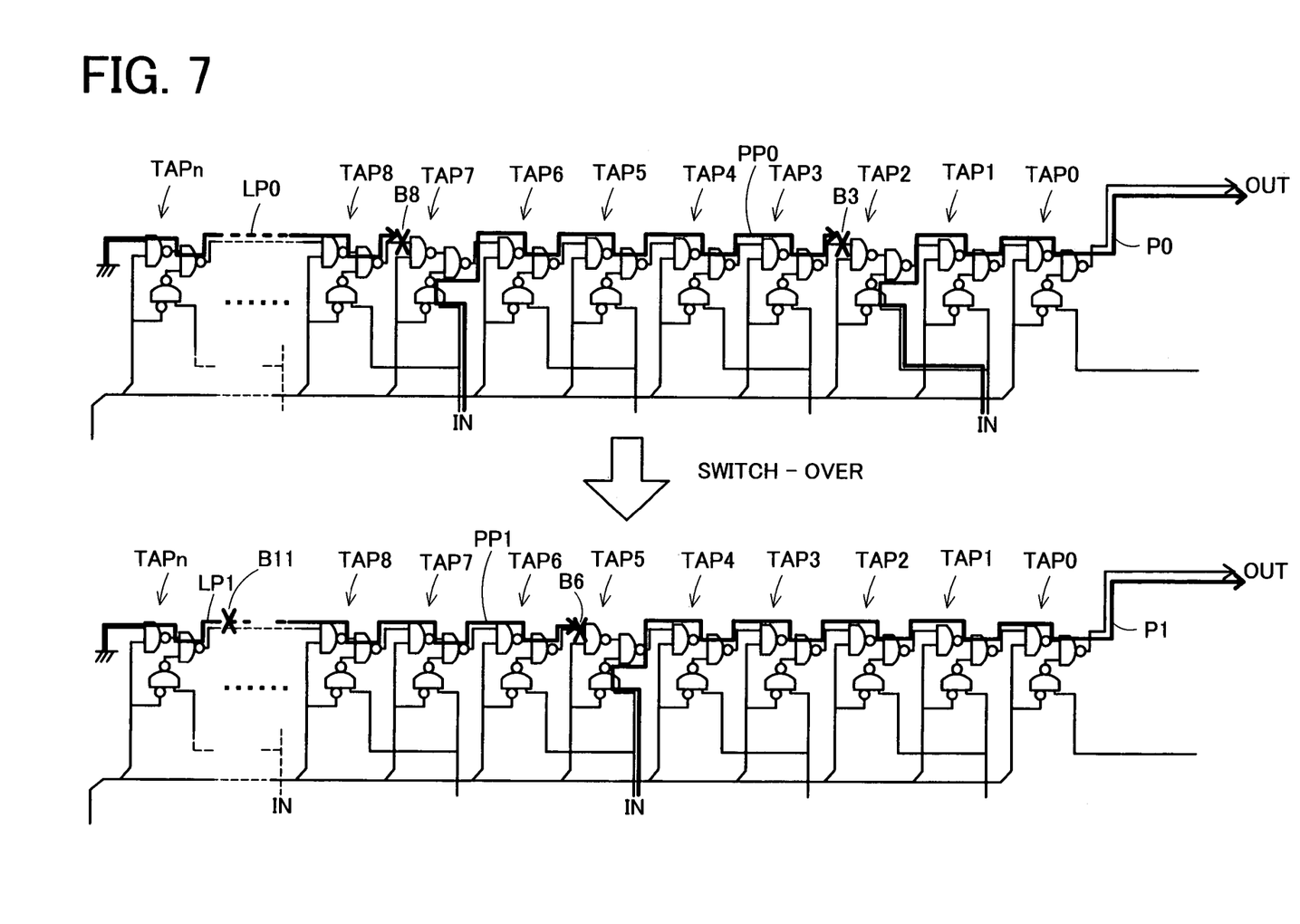
FIG. 7 is an explanatory diagram showing the switch-over operation of the tap in a delay circuit when a plurality of taps are selected at the same time.

FIG. 7 shows the status of the signal path upon switching of the tap when two taps are selected at the same time. If a tap TAP2 is selected prior to the switching-over, a signal path P0 in which the signal IN is inputted from the signal input terminal and propagated to the output terminal is established. Because the tap TAP7 is selected at the same time, an addition signal path PP0 in which the signal IN of the same phase is inputted and propagated is established from here. Although the addition signal path PP0 is formed in the signal propagation direction of the delay circuit, the propagation is blocked (B3) at a between-stages connecting terminal of the proper selection tap TAP2. The reason is that the output signal of the NAND gate connected to the between-stages connecting terminal is fixed to high level. Therefore, no signal propagated by the signal path P0 is interfered by a signal propagated by the addition signal path PP0. Further, the signal level on the addition signal path PP0 is set up depending on the signal IN. That is, each between-stages connecting terminal of the taps TAP6–TAP3 disposed in the middle is maintained at a signal level having a propagation delay of unit delay time (τ) for each tap.

If the tap TAP5 is selected after the switch-over, the signal IN is inputted from the signal input terminal so that the signal path P1 is established. In this signal path P1, the addition signal path PP0 is established on the taps TAP3 and TAP4, located between the tap TAP2 selected before the switch-over and if the same phase signal IN is inputted, the signal level set in the addition signal path PP0 matches a signal level of the signal IN when it is propagated from the tap TAP5. No erroneous signal level such as hazard accompanied by the switch-over is outputted from the output terminal OUT.

After the switch-over, the tap TAP10 (not shown) is selected at the same time and as a consequence, the addition signal path PP1 in which the same phase signal IN is inputted and propagated is established. The addition signal path PP1 is blocked (B6) by a between-stages connecting terminal of the tap TAP5 selected as described previously.

A low level signal which is a ground potential is propagated from the final stage tap TAPn (signal path LP0, LP1) and needless to say, the signal path is blocked (B8, B11) by the between-stages connecting terminals of the taps TAP7, TAP10 selected at the same time.

Although in the indicated case, the tap selection signal selected additionally with the proper tap selection signal is selected at the same time in any of the first and second circuits, it may be selected additionally before the switch-over to the next tap selection signal and it does not always be selected at the same time. If there is a control signal (not shown) outputted at a timing ahead of the tap switch-over, it is permissible to have such a construction in which a tap selection signal for the additional selection is outputted corresponding to this control signal.

According to the embodiment of the present invention as described in detail above, any unnecessary signal inputted through the between-stages connecting terminal from a preceding tap of the tap to which an objective signal is propagated is never propagated to the signal path of the objective signal because an output signal of the NAND gate to which the between-stages connecting terminal is connected in a selected tap is fixed to high level. If upon the tap switch-over, the tap selection signals TAP[n:0], which should maintain its non-selective condition, turns to selective condition temporarily due to hazard and an objective signal is propagated from the tap at an erroneous position, the propagation of the signal can be blocked with the between-stages connecting terminal of a tap at a proper selection position. Consequently, an erroneous delay signal is prevented from being outputted from the output terminal OUT accompanied by erroneous activation at the time of signal switch-over.

By selecting two tap selection signals, when a currently selected tap is switched over to any tap located at a position backward by a predetermined distance, the signal level on a signal path sandwiched by taps before and after the switch-over turns to a signal level which matches well an objective signal after the switch-over. Consequently, at the time of the switch-over, any fluctuation of unnecessary signal level in the output signal can be prevented.

Further, because the signal path from the input terminal IN to the signal input terminal of each tap is constructed in tree structure, the propagation delay time of the input signal IN can be equalized. When the delay circuit is constructed by connecting the taps in series to multiple stages, the delay time of the signal path of the input signal IN to any tap can be equalized so that a predetermined delay time can be applied accurately.

Further, if the number of the connection stages of the taps becomes multiple and the binary series are constructed in multiple bits also, it is possible to obtain the decode bit string in synchronous condition while suppressing the number of the composition of the flip-flops. Consequently, the tap switch-over can be carried out stably without generating any erroneous output of the tap selection signal at the time of tap switch-over, while suppressing the circuit size.

Meanwhile, the present invention is not restricted to the above-described embodiments and needless to say, can be improved or modified in various ways within a scope not departing from the gist of the present invention.

What is claimed is:

1. A delay circuit for receiving an objective signal at any unit delay unit of a plurality of unit delay units connected in series so as to provide a predetermined delay time, wherein each unit delay unit comprises:
    a first logical portion for propagating a signal inputted to a first input terminal and outputting a first propagation signal corresponding to a first unit selection signal indicating selective status;
    a second logical portion for propagating a signal inputted to a second input terminal and outputting a second propagation signal corresponding to a second unit selection signal indicating non-selective status, having the same propagation delay time as the first logical portion; and
    a third logical portion for propagating the first propagation signal outputted from the first logical portion and the second propagation signal outputted from the second logical portion and outputting a third signal to an output terminal; and
    wherein the delay circuit comprises an independent unit delay unit in which the objective signal is inputted to the first input terminal and which is maintained in a state in which signal propagation of the objective signal is possible, wherein a unit delay time in the unit delay unit is capable of being measured, wherein
    the objective signal being inputted to the first input terminal and the output terminal of the unit delay unit of a preceding stage being connected to the second input terminal.

2. The delay circuit according to claim 1 further comprising:
    a unit additional selection signal indicating selective status corresponding to the first unit selection signal indicating selective status, wherein, of the plurality of unit delay units connected in series, together with the unit delay unit turned into selective status corresponding to the first unit selection signal, the unit delay unit existing at a position backward by a predetermined distance in a signal propagation direction from the unit delay unit is turned to selective status.

3. The delay circuit according to claim 2 wherein the unit additional selection signal is selected at the same time as the first unit selection signal.

4. The delay circuit according to claim 2 wherein the unit additional selection signal is selected prior to switch-over to a next selection signal.

5. The delay circuit according to claim 1 wherein the objective signal is supplied to every unit delay unit at the same time through a signal path having the tree structure branched successively for each buffer circuit disposed at multiple stages and having equivalent delay components connected to the first input terminal of each unit delay unit.

6. The delay circuit according to claim 5 wherein the buffer circuit has equivalent structure at each stage.

7. The delay circuit according to claim 5 wherein a signal wiring for connecting the buffer circuits between stages has equal length.

8. The delay circuit according to claim 1 further comprising, of binary series for identifying the plurality of unit delay units connected in series, a upper decoder for decoding upper bit string of a predetermined bit number;
    a lower decoder for decoding remaining lower bit string;
    a synchronous obtaining portion for obtaining the upper decoded bit string and lower decoded bit string outputted from the upper decoder and the lower decoder, synchronously; and
    a logical operating portion for executing logical product operation by combining the upper decode bit string and the lower decode bit string obtained by the synchronous obtaining portion for each bit.

9. A control method of delay circuit for inputting an objective signal from any unit delay unit selected among a plurality of unit delay units connected in series so as to provide with a predetermined delay time, comprising the steps of:
    establishing a signal path for propagating the objective signal inputted in the unit delay unit selected,
    blocking a signal path from the unit delay unit of proceeding stage in the unit delay unit selected,
    blocking a signal path for propagating the objective signal inputted in the unit delay unit not selected,
    establishing a signal path from the unit delay unit of a preceding stage in the unit delay unit not selected, and
    selecting the unit delay unit existing at a position backward by a predetermined distance in a signal propagation direction from the unit delay unit as well as the unit delay unit selected.

10. The control method of delay circuit according to claim 9 wherein the step of selecting the unit delay unit is carried out before the unit delay unit selected is switched over to the unit delay unit disposed between the unit delay unit currently selected and the unit delay unit disposed backward by a predetermined distance in the signal propagation direction.

* * * * *